(12) United States Patent
Horsky et al.

(10) Patent No.: US 8,179,156 B2
(45) Date of Patent: May 15, 2012

(54) CAPACITOR TEST METHOD AND CIRCUIT THEREFOR

(75) Inventors: Pavel Horsky, Brno (CZ); Petr Kamenicky, Brno (CZ)

(73) Assignee: Semiconductor Components Industries, LLC, Phoenix, AZ (US)

( * ) Notice: Subject to any disclaimer, the term of this patent is extended or adjusted under 35 U.S.C. 154(b) by 338 days.

(21) Appl. No.: 12/621,951

(22) Filed: Nov. 19, 2009

(65) Prior Publication Data

US 2011/0115520 A1    May 19, 2011

(51) Int. Cl.
*G01R 31/40* (2006.01)

(52) U.S. Cl. .................................. 324/764.01

(58) Field of Classification Search .................. None
See application file for complete search history.

(56) References Cited

U.S. PATENT DOCUMENTS

| 5,309,446 | A | * | 5/1994 | Cline et al. ................ 714/718 |
| 5,589,802 | A | | 12/1996 | O'Shaughnessy et al. |
| 5,648,759 | A | | 7/1997 | Miller et al. |
| 6,624,710 | B2 | | 9/2003 | Tian |

* cited by examiner

*Primary Examiner* — Paresh Patel
(74) *Attorney, Agent, or Firm* — Robert F. Hightower

(57) ABSTRACT

In one embodiment, a closed loop control system is caused to operate in an open loop configuration. At some time while operating in the open loop configuration the system detected the presence or absence of a.c. signals in an output signal of the system in order to detect the presence or absence of a failure of a control loop element, such as an output capacitor.

20 Claims, 5 Drawing Sheets

CAPACITOR TEST METHOD AND CIRCUIT THEREFOR

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form voltage regulator circuits that could be used to supply a regulated voltage to a load. In an application to use the regulator to supply power to a load, a filter capacitor generally was connected to the output of the voltage regulator in order to filter noise from the voltage and to provide stored energy to the load or to form a main pole in the regulator control loop. In some cases, the equivalent series resistance of the capacitor increased or the capacitor value decreased which caused an increase in the amount of noise in the output voltage or could also cause instability of the control loop. In other cases it was possible for the connections between the capacitor and the output of the voltage regulator to become damaged so that the capacitor was no longer connected thereby also causing an increase in the amount of noise on the output voltage or control loop instability since the filtering effect of the capacitor was no longer effective.

FIG. 1 schematically illustrates a prior art circuit that was utilized to detect a missing capacitor. The circuit of FIG. 1 utilized a peak detector to detect when the a.c. portion of the output voltage increased above a specific value. The regulator included a feedback circuit illustrated by resistors R1-R3. At a periodic interval, a periodic pulse was applied to transistor T1 to periodically enable transistor T1 and short the value of resistor R3 thereby periodically changing the value of the resistor divider and the feedback voltage. During the time interval when the periodic pulse was applied to transistor T1 a peak detector would check the output voltage for increased value of the a.c. portion of the output voltage. If an increase was detected, it was assumed that the capacitor was missing. However, periodically changing the value of the resistor divider also caused undesirable variations and overshoot of the output voltage. Another problem was that EMI could also induce a.c. signals on the output voltage and the circuit of FIG. 1 could not detect the difference between EMI disturbances and a missing capacitor.

Accordingly, it is desirable to have a method and circuit to detect a missing capacitor and to determine the difference between externally coupled EMI disturbances and a missing capacitor.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices a person of ordinary skill in the art will appreciate that complementary devices are also possible in accordance with the present invention. It will be appreciated by those skilled in the art that the words during, while, and when as used herein relating to circuit operation are not exact terms that mean an action takes place instantly upon an initiating action but that there may be some small but reasonable delay, such as a propagation delay, between the reaction that is initiated by the initial action. Additionally, the term while means that a certain action occurs at least within some portion of a duration of the initiating action. The use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten per cent (10%) (and up to twenty per cent (20%) for semiconductor doping concentrations) are reasonable variances from the ideal goal of exactly as described. When use in reference to a state of a signal, the term asserted means an active state of the signal and inactive means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used.

DETAILED DESCRIPTION OF THE DRAWINGS

Figure 2:
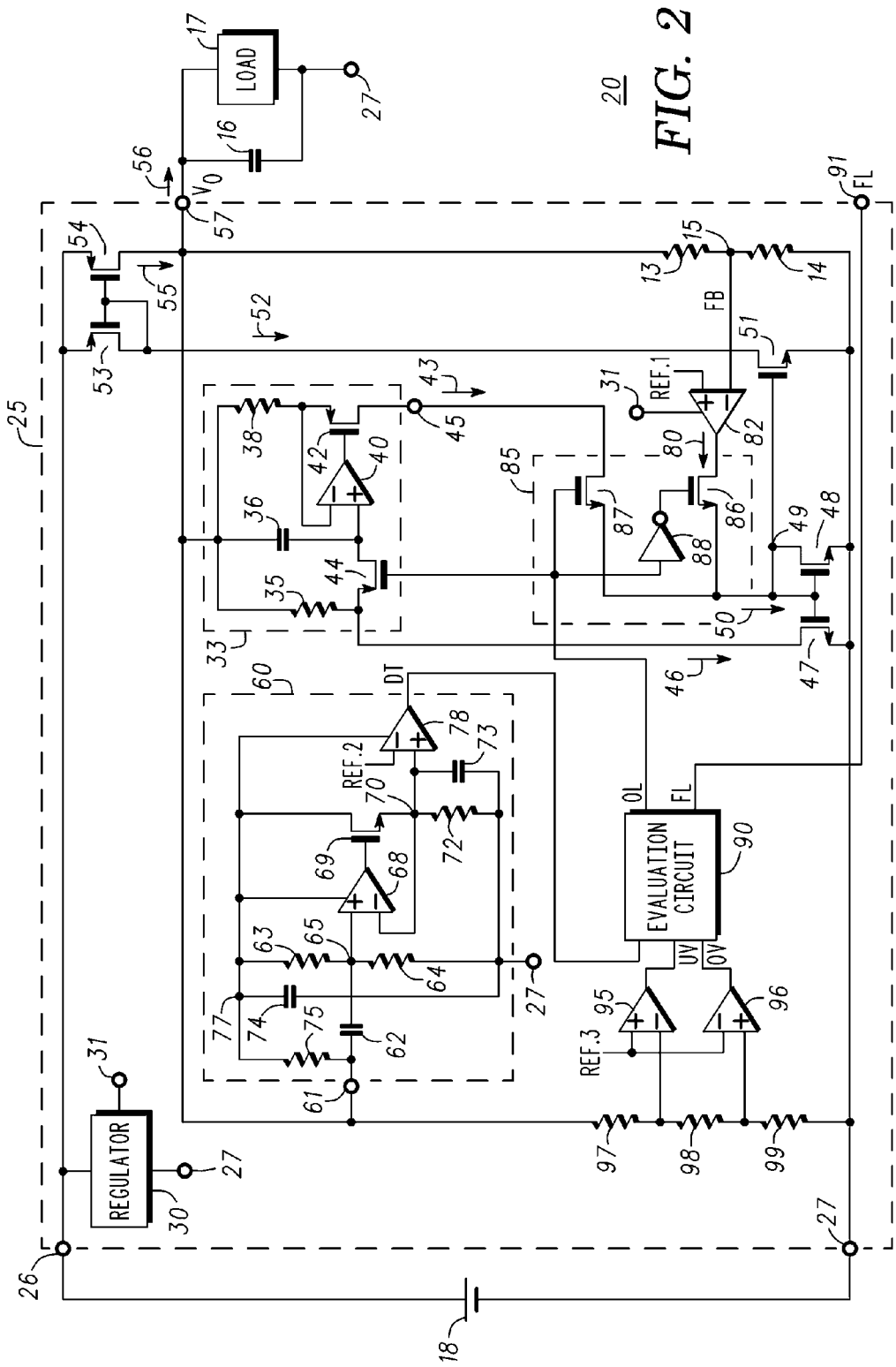
FIG. 2 schematically illustrates an example of a voltage regulation system that includes a portion of an embodiment of an example of a voltage regulator in accordance with the present invention.

FIG. 2 schematically illustrates an example of a voltage regulation system 20 that includes a portion of an embodiment of an example of a voltage regulator 25. Voltage regulator 25 is configured to have a component test circuit that detects, among other things, a missing output capacitor on an output of regulator 25 and that determines the difference between a missing output capacitor and a.c. signals that are induced on the d.c. value of the output voltage by EMI disturbances. As will be seen further hereinafter, regulator 25 and the included component test circuit is also configured to detect various component failures that can cause instability in the control loop that includes regulator 25 wherein these component failures can cause a.c. signals to occur on the d.c.

value of output voltage. These component failures include, among other things, the output capacitor being missing, a missing connection between the output capacitor and the output of regulator 25, a change in the value of the capacitor, an increase in the equivalent series resistance of the capacitor or an increase in the resistance of any connections between the output of regulator 25 and a load connected to the output including an increase in the resistance between the output of regulator 25 and the output capacitor. As used herein, the term component failure refers to these types of component failures. Regulator 25 is also configured to detect the difference between such a component failure and a.c. signals that are induced on the d.c. output voltage by EMI disturbances.

Regulator 25 includes an input terminal or input 26 that is configured to receive an input voltage such as a DC voltage from a voltage source 18. Regulator 25 also includes a common voltage return terminal or return 27 that typically is connected to a common voltage value such as the negative voltage of source 18. Regulator 25 is configured to form a regulated output voltage on an output 57 in order to supply power to a load such as a load 17. An output capacitor 16 is connected to output 57 to filter some of the noise on the output voltage and provide a storage element to assist in supplying power to load 17. Regulator 25 generally includes an error amplifier 82 that is coupled to receive a feedback (FB) signal that is representative of the output voltage formed on output 57 so that regulator 25 may regulate the value of the output voltage responsively to the value of the feedback signal. Consequently, amplifier 82 also receives a reference voltage from a reference generator circuit (Illustrated as Ref 1) and regulator 25 regulates the output voltage so that the FB signal is substantially equal to the reference voltage. Regulator 25 also includes a detection circuit 60, a current control circuit 33, an evaluation circuit 90, and an output circuit that includes transistors 48, 51, 53, 54, 86, and 87, and an inverter 88. A multiplexer circuit 85 of the output circuit includes transistors 86 and 87 along with inverter 88. In most embodiments, regulator 25 also includes an overvoltage (OV) detection circuit and an under-voltage (UV) detection circuit that form respective overvoltage (OV) and under-voltage (UV) signals. For the embodiment of regulator 25 that is illustrated in FIG. 2, a comparator 95 is illustrated as the under-voltage (UV) detection circuit and a comparator 96 is illustrated as the overvoltage (OV) detection circuit. Those skilled in the art will appreciate that resistors 97-99 and a reference voltage generator (Ref 3) are also a portion of the OV and UV detection circuits. In some embodiments, regulator 25 may also include an internal voltage regulator 30 that is coupled to receive the input voltage from input 26 and form an internal operating voltage on an output 31 that is used to operate some of the elements of regulator 25.

Those skilled in the art will appreciate that output capacitor 16 forms a dominant pole that affects the stability of the control loop of system 20 which includes regulator 25. In some embodiments, amplifier 82 may also include stability compensation elements to compensate the frequency response of the control loop so that the control loop is stable for the frequency ranges over which the control loop operates, and in other embodiments amplifier 82 may not have such compensation elements. If capacitor 16 is missing or not connected, the frequency compensation changes and the control loop may become unstable and form a.c. signals on the d.c. value of the output voltage. Additionally, the other component failures may also change the center frequency of the dominant pole and cause it to move in frequency which can also cause instability and result in a.c. signals on the d.c. value of the output voltage. The a.c. signals on the output voltage caused by component failures can cause improper operation of load 17 or may damage load 17. Thus, it may be desirable to detect such component failures and differentiate such failures from EMI induced a.c. signals.

Detection circuit 60 is configured to detect a.c. signals that are formed on the output voltage and includes an output that forms a detected (DT) control signal. For the example embodiment of regulator 25 that is illustrated in FIG. 2, circuit 60 includes an amplifier 68, a transistor 69, capacitors 62, 73, and 74, resistors 63, 64, 75, and 72, a comparator 78, and a reference generator circuit (illustrated as Ref. 2). Current control circuit 33 is configured to form a control signal having a substantially fixed value on an output of circuit 33. The example embodiment of current control circuit 33 includes an output 45, a switch (such as a transistor 44), resistors 35 and 38, a storage element (such as a capacitor 36), and a voltage to current translator such as amplifier 40 and a transistor 42. Some of the elements of regulator 25, such as amplifier 82 and Ref 3 operate from the internal operating voltage on output 31 of regulator 30. Most of the elements of regulator 25, such as circuits 33 and 60, use an operating voltage that is substantially equal to the value of the output voltage on output 57. Although not shown in FIG. 2 for clarity of the drawings, amplifier 40, comparators 95 and 96, and evaluation circuit 90 typically also operate from a voltage that is substantially equal to the value of the output voltage. Those skilled in the art will appreciate that circuits 33 and 60 operate from the voltage that is substantially equal to the output voltage since it is more regulated than the internal operating voltage from regulator 30. However, the source of the operating voltage may be different as long as the operating voltage is sufficiently regulated.

As will be seen further hereinafter, regulator 25 is formed to include two operating modes, a normal operating mode and an open loop operating mode. Regulator 25 forms an output current 56 that is used to charge capacitor 16 and supply current to load 17. In the normal operating mode, regulator 25 operates as a closed loop control system and regulates the value of the output voltage and the value of current 56 responsively to the feedback signal. Regulator 25 regulates the output voltage to a target value within a range of values around the target value. For example, the target value may be five volts (5v) and the range of values may be plus or minus five percent (5%) around the five volts. While operating in the open loop operating mode, regulator 25 operates as an open loop control system and does not use the value of the FB signal to form the output voltage or regulate the output voltage. In the preferred embodiment, the open loop operating mode of regulator 25 forms the output voltage and current 56 responsively to a signal having a substantially fixed value and not responsively to the feedback signal. In other embodiments, regulator 25 may not supply current 56 during the open loop operating mode.

Evaluation circuit 90 is configured to cause regulator 25 to operate in the open loop operating mode or the normal operating mode and is also configured to determine the absence or presence of a component failure and determine the difference between EMI induced signals and a component failure. For the example embodiment of regulator 25 that is illustrated in FIG. 2, circuit 90 includes an output that forms an open loop control signal or OL signal and another output that forms a failure (FL) control signal or FL signal. In the preferred embodiment, circuit 90 is a digital logic circuit.

Figure 1:
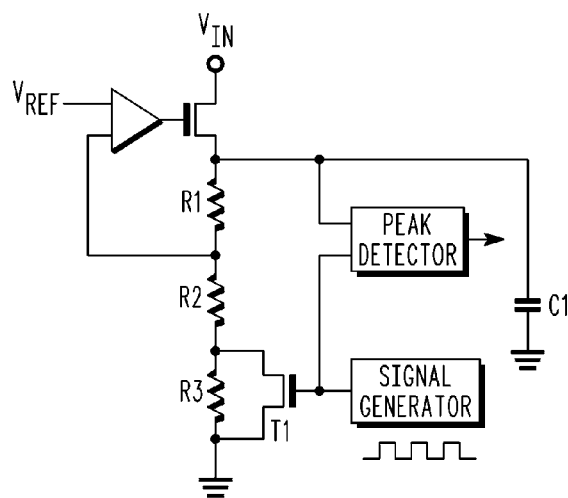
FIG. 1 is a schematic illustrating a portion of a prior art voltage regulator.
Figure 3:
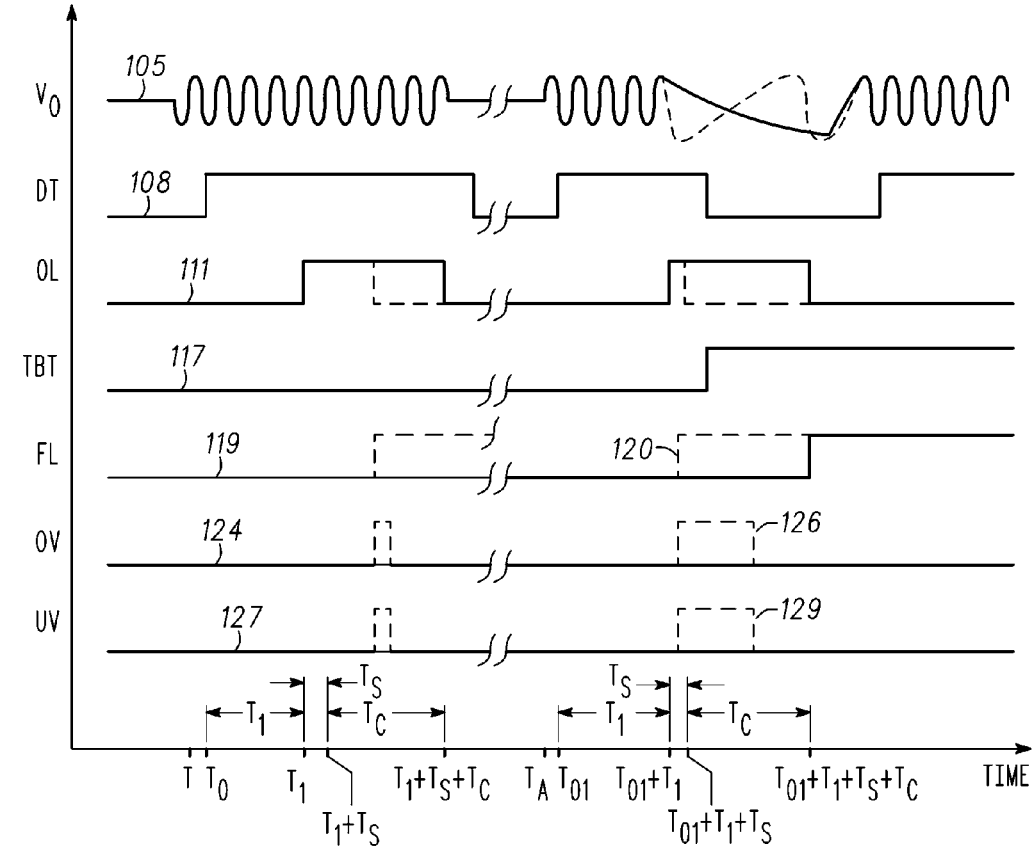
FIG. 3 is a graph having plots that illustrate some portions of some of the signals formed during the operation of the regulator of FIG. 2 in accordance with the present invention.

FIG. 3 is a graph having plots that illustrate some of the states or values of some of the signals that are formed during the operation of regulator 25. The abscissa indicates time and the ordinate indicates increasing value of the illustrated signal. A plot 105 illustrates the value of the output voltage on output 57. A plot 108 illustrates the value of the DT signal on the output of circuit 60. A plot 111 illustrates the OL signal of circuit 90 and plot 119 illustrates the FL signal of circuit 90. A plot 117 illustrates a state of a TBT control bit or flag bit that usually is internal to circuit 90. A plot 124 illustrates the OV signal on the output of comparator 96 and a plot 127 illustrates the UV signal on the output of comparator 95. Those skilled in the art will appreciate that the a.c. signals formed on the output voltage on output 57 may not be a periodic a.c. signal having a smooth amplitude and period but may have a variety of frequencies and amplitudes. Thus, plot 105 illustrates the a.c. signals as a regular a.c. signal merely for clarity of the drawings and the shape of the waveform illustrated by plot 105 is not expected to be representative of the waveform of the a.c. signals that are formed on the d.c. value of the output voltage.

Figure 4A:
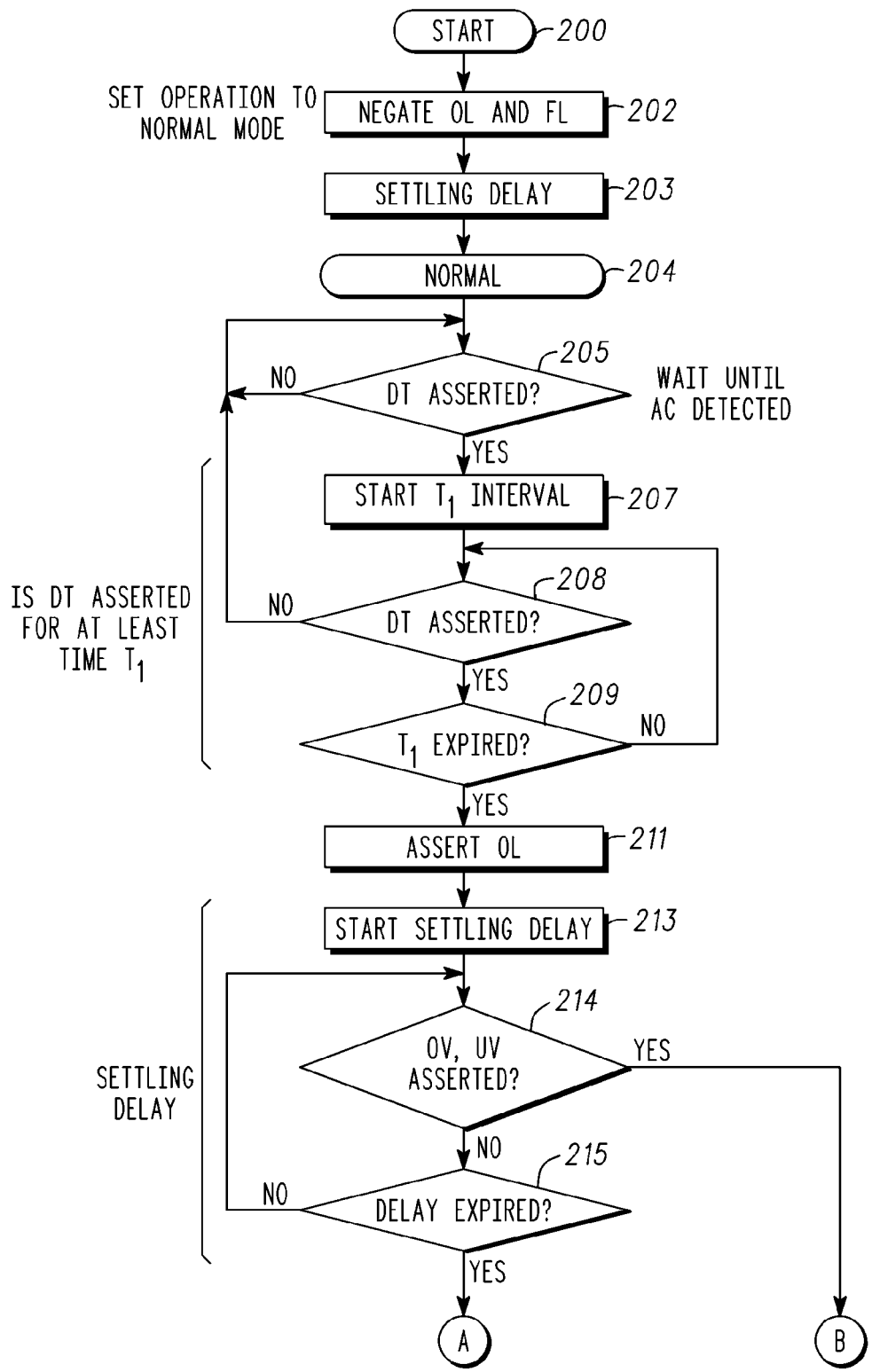
FIG. 4 is a simplified flowchart that illustrates some of the operations that are performed by the voltage regulator of FIG. 2 in accordance with the present invention.
Figure 4B:
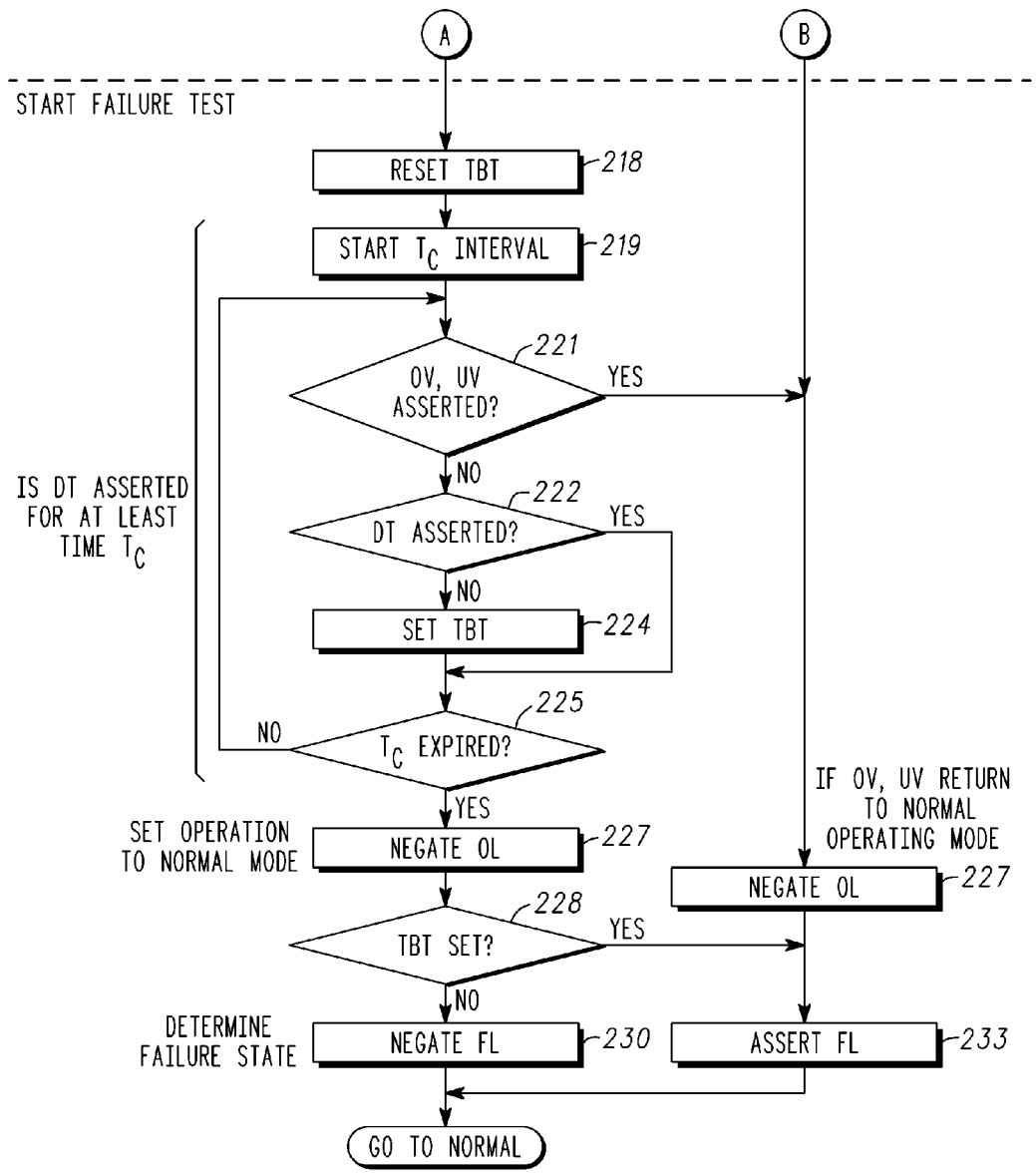

FIG. 4 is a simplified flowchart that illustrates some of the operations that are performed by regulator 25 or operating states of regulator 25. This description has references to FIG. 2, FIG. 3, and FIG. 4 in order to explain the operation of regulator 25.

After power is applied to regulator 25, such as from voltage source 18, regulator 25 is initialized to operate in the normal operating mode. This can be seen from the flowchart of FIG. 4 where it is illustrated in flowchart blocks 200, 202, and 203 that upon startup regulator 25 negates the OL and FL signals on the output of circuit 90, followed by a settling time in block 203 to allow the circuits of regulator 25 to stabilize. Assuming that a positive logic convention is used, circuit 90 forces the OL signal on an OL output of circuit 90 low to negate the OL signal. The low OL signal disables transistor 87 and enables transistor 86 through inverter 88. Enabling transistor 86 couples an error signal from the output of amplifier 82 to a node 49 which causes a current 50 to flow through transistor 48. The error signal on the output of amplifier 82 forms a current 80 on the output of amplifier 82 so that current 80 is representative of the error signal. Current 80 flows through transistor 48 as current 50. Transistor 48 is connected in a current mirror configuration with transistor 51, thus, current 50 in transistor 48 causes a current 52 to flow through both transistors 51 and 53. Because of the current mirror configuration, current 52 is ratioed to the value of the current 50, thus, to current 80. Transistor 53 is connected in a current mirror configuration with output transistor 54 thereby causing a current 55 to flow through transistor 54, thus, current 55 is ratioed to the value of current 52 and to current 50, thus, ratioed to the value of the error signal. A very small portion of current 55 flows through resistors 13 and 14 in order to form the FB signal; however, the majority of current 55 flows through output 57 as output current 56. Those skilled in the art will appreciate that when load 17 is in a powered down condition, the value of current 56 may become smaller, thus, the value of current through resistors 13 and 14 may be a larger per cent of current 55 but that current 56 is still larger that the current through resistors 13 and 14. As can be seen, as the value of the output voltage on output 57 changes during the normal operating mode, the value of the feedback signal at a node 15 also changes thereby causing the value of output current 56 to also change in order to regulate the value of the output voltage. Thus, regulator 25 is not a switching regulator and does not switch output current 56 between an on-state and an off-state to regulate the output voltage.

Transistor 48 is also connected in a current mirror configuration with transistor 47 thereby forming a current 46 through transistor 47 that is ratioed to the value of current 50, thus, to the value of current 80. Current 46 also flows through resistor 35 of circuit 33 forming a voltage across resistor 35 that is representative of the error signal formed by error amplifier 82. Since transistor 44 of circuit 33 is a P-channel transistor, the low OL signal from circuit 90 also enables transistor 44. Enabling transistor 44 allows capacitor 36 to be charged to substantially the same voltage that is formed across resistor 35, thus, a voltage is formed on capacitor 36 that is representative of the average value of the error signal formed by amplifier 82. Amplifier 40, transistor 42, and resistor 38 form a voltage-to-current translator circuit that forms a current 43 flowing through output 45 of circuit 33 that is representative of the error signal from amplifier 82. However, the low OL signal from circuit 90 keeps transistor 87 disabled so that current 43 is not connected to affect the value of the output voltage on output 57.

Circuit 60 receives the output voltage from output 57 on an input 61 of circuit 60. A capacitor 74 and a resistor 75 form a voltage source that is used to provide an operating voltage to operate elements of circuit 60 including amplifier 68 and comparator 78. Capacitor 74 receives the input voltage from input 61 through resistor 75 which charges capacitor 74 to a voltage that is substantially equal to the output voltage on output 57, thus, capacitor 74 forms the operating voltage for elements of circuit 60 on a node 77. Resistor 75 and capacitor 74 form a filter that reduces noise on the voltage at node 77 thereby improving the quality of the voltage. Those skilled in the art will appreciate that there may be some small voltage drop across resistor 75 but that the voltage at node 77 is substantially equal to the value of the output voltage on output 57. Circuit 60 also receives the input voltage on input 61 in order to detect the a.c. signals that that may be formed on, thus that affect, the d.c. value of the output voltage on output 57. A capacitor 62 decouples the detection circuitry of circuit 60 from the d.c. value of the output voltage on output 57 thereby allowing only the a.c. component or the a.c. signal of the output voltage to be coupled to amplifier 68. Resistors 63 and 64 provide a bias voltage at a node 65 in order to bias the non-inverting input of amplifier 68 to a value that facilitates detecting the ac signal from capacitor 62. If there are no a.c. signals formed on the output voltage, amplifier 68 forms a voltage at a node 70 that is substantially equal to the bias voltage on node 65, thus, capacitor 73 is charged to a voltage substantially equal to the voltage on node 65. The value of the voltage from Ref 2 is chosen so that the output of comparator 78 is negated for this value of voltage on capacitor 73. If there are a.c. signals on the d.c. value of the output voltage on output 57, the a.c. component of the a.c. signals is coupled across capacitor 62 to the non-inverting input of amplifier 68 causing amplifier 68 to increase the value of the voltage on node 70 which increases the voltage on capacitor 73 to a value that is substantially equal to the node 65 bias voltage plus the peak value of the a.c. signal. The additional voltage added to the voltage of capacitor 73 forces the output of comparator 78 high thereby asserting the detected (DT) control signal. Thus, circuit 60 detects the presence of a.c. signals on the output voltage and responsively asserts the DT control signal. Those skilled in the art will appreciate that other values than the peak value of the a.c. signals may be used to detect the presence of the a.c. signals.

In the preferred embodiment, capacitor 62 along with resistors 63 and 64 form a high pass filter that has a corner frequency below the frequency of the a.c. signals that are to be detected. Capacitor 73 and resistor 72 form a low pass filter that filters the a.c. signal from the signal that is formed on node 70. The gain bandwidth product of amplifier 68 limits the maximum frequency of the a.c. signals that can be detected by circuit 60. In one example embodiment, the frequency of the a.c. signals formed on the output voltage have a frequency of about two to five mega-Hertz (2-5 MHz) and the frequency range of circuit 60 is about one to ten mega-Hertz (1-10 MHz). For this example, the corner frequency of the filter formed by capacitor 62 and resistors 63 and 64 is around six hundred kilo-Hertz (600 kHz). Because circuit 60 uses peak detection, detector 60 usually detects the a.c. signal within one or two (1-2) cycles of the a.c. signal.

The settling time formed at flowchart block 203 generally is used to provide time for circuits 33 and 60 in addition to multiplexer 85 to stabilize also to allow the control loop and the output voltage to stabilize. As illustrated by flowchart block 205, after the settling delay illustrated by flowchart block 203, regulator 25 operates in the normal operating mode and regulates the value of the output voltage responsively to the FB signal and circuit 60 monitors the output voltage for a.c. signals on the d.c. value of the output voltage.

Referring again to FIG. 3, assume that at a time T a.c. signals begin to occur in the output voltage. The a.c. signals may be caused as a result of EMI that has induced signals on the output voltage or may be caused by a component failure including capacitor 16 not being connected to output 57. For the purpose of this example explanation, assume that capacitor 16 is connected and that there are no component failures. Detection circuit 60 detects the a.c. signals and asserts the DT signal as illustrated by plot 108 at a time T0. Circuit 90 receives the asserted DT signal and uses the state of the DT signal to determine if the a.c. signals continuously occur over a time interval illustrated by a time interval T1 in flowchart blocks 207-209. If the a.c. signals cease anytime during this time interval, circuit 60 negates the DT signal and regulator 25 continues to regulate the value of the output voltage responsively to the FB signal as illustrated by flowchart blocks 205-208. If the a.c. signals are present for less than the T1 time interval, it is assumed that they are a transient external disturbance, such as caused by EMI, and are not evaluated further.

If the a.c. signals are substantially continuous over the T1 time interval as illustrated by the time interval T0 to T1 in FIG. 3, the a.c. signals may result from a component failure including capacitor 16 not being connected to output 57, or from EMI disturbances. In order to determine the cause of the a.c. signals, circuit 90 asserts the OL signal in order to set regulator 25 operating in the open loop operating mode as illustrated by flowchart block 211. The high OL signal disables transistor 44 of circuit 33 thereby decoupling capacitor 36 from resistor 35 so that capacitor 36 remain charged to a voltage that is representative of the average value of the error signal at the time the OL signal was asserted. Thus, capacitor 36 stores the average value of the error signal. Consequently, while the preferred embodiment of regulator 25 is operating in the open loop operating mode the voltage on capacitor 36 remains substantially fixed regardless of the value of the output voltage, thus, the value of current 43 also remains substantially fixed. The high OL signal also disables transistor 86 through inverter 88 thereby decoupling circuit 33 from receiving the signal that is representative of the error signal. The high OL signal also enables transistor 87 which couples current 43 to transistor 48. Since the current through transistor 48 is now current 43, the current mirror configuration of transistors 48 and 51 and the current mirror configuration of transistors 53 and 54 causes output current 56 to have a substantially constant value that is ratioed to the value of current 43. Thus, current 56 has a substantially constant value. As will be appreciated by those skilled in the art, the example embodiment of circuit 33 uses capacitor 36 to store the average value of the error signal. When a.c. signals appear on the output voltage, the average value of the error signal includes the average value of the undesired a.c. signals. Thus, the stored value of the error signal may be too great for the desired value of the output voltage. Therefore, in the preferred embodiment current 56 is formed to be representative of less than the error signal, thus, is formed to be ratioed to such error signal value. The lower value for current 56 assists in keeping the output voltage to a value that does not increase to a value that may damage load 17. For example, current 56 may be formed to be representative of a value that is ratioed to the value of the error signal, such as about eighty per cent (80%) of the value of the error signal. The ratio between the areas of current mirror transistors 47 and 48 may be selected to form the ratio. In other embodiments, current 56 may have a different ratio to the error signal value or may have a substantially constant value that is representative of the value of the error signal just prior to operating in the open loop operating mode or may have other fixed values. For example, current 56 may be fixed to some value that is representative of a typical power consumption of load 17. In other embodiments, current 56 may not be formed during the open loop operating mode or may be formed for just a portion of the open loop operating mode.

As illustrated by flowchart block 213, circuit 90 initializes a settling delay (Ts see FIG. 3) after asserting the OL signal to allow the circuits of regulator 25 to settle and avoid transients. The OV and UV signals are checked during the settling time to make sure that the output voltage remains within the desired operational range. Since capacitor 16 is assumed to be connected for this example, the value of the output voltage would not be expected to cause an OV or UV occurrence. However, if either OV or UV is asserted during the settling delay time interval, circuit 90 asserts the failure (FL) control signal on output 91 as a high signal as illustrated by dashed lines 120 in plot 119 and causes regulator 25 to return to operating in the normal operating mode. This operational sequence is shown in the settling delay sequence by flowchart block 214.

Referring back to the waveforms of FIG. 3, after time T1 regulator 25 begins operating in the open loop operating mode. If none of the component failures have occurred, the a.c. signals on the output voltage will continue while regulator 25 is operating in the open loop operating mode and detector 60 will detect the a.c. signals. Consequently, the DT signal will remain asserted because the a.c. signals are continuing. However, if one of the component failures have occurred, including capacitor 16 being missing or just no longer connected to output 57, the a.c. signals would stop since there is no longer a dominant pole connected to output 57 to cause the a.c. signals or because the frequency of the dominant pole has moved such that the a.c. signals are no longer formed. Circuit 90 determines if one of the component failure is present by determining if the a.c. signals continue substantially constantly for a second time interval or determines if one of the component failures is absent by determining if the a.c. signals are absent anytime during the second time interval. In order to determine if the a.c. signals are present substantially continuously over the second time interval, the preferred embodiment of circuit 90 includes a test bit (TBT) or flag that stores a state that will be used to signify that one of the component failures is present or absent. Flowchart block 218 indicates that circuit 90 ensures that TBT is reset at the beginning the sequence of determining the presence or absence of one of the component failures. Flowchart blocks 219-225 illustrate that circuit 90 forms a failure time interval (Tc) while evaluating the presence of a.c. signals. During the Tc time interval illustrated by the loop of blocks 221-225, circuit 90 also checks for an OV or a UV signal as will be seen further hereinafter. If the DT signal remains asserted substantially constantly during the Tc time interval, it is assumed that none of the component failures occurred and that the a.c. signals must be the result of an external interference such as EMI. Flowchart blocks 222 and 224 illustrates that if the DT signal remains asserted, circuit 90 maintains the test bit (TBT) reset, but if DT becomes negated anytime during the Tc time interval circuit 90 sets TBT to indicate the absence of a.c. signals and the presence of one of the component failures. After the Tc time interval expires, circuit 90 negates the OL signal and causes regulator 25 to again operate in the normal operating mode as illustrated by flowchart block 227 and by plot 111 at time T1+Ts+Tc in FIG. 3. Because the a.c. signals were substantially constant during the Tc time interval, TBT is reset and circuit 90 ensures that the failure (FL) control signal remains negated and operation returns to the normal operating mode as illustrated by flowchart blocks 230 and 204.

Referring again to FIG. 3, assume that at a time $T_A$ a.c. signals begin to occur in the output voltage. The a.c. signals may be caused as a result of EMI that has induced signals on the output voltage or may be caused by a component failure including capacitor 16 not being connected to output 57. For the purpose of this example explanation, assume that one of the failure modes occurred, such as capacitor 16 being missing or not connected to output 57.

Regulator 25 again asserts the DT signal at a time $T_{O1}$ and determines if the a.c. signals occur substantially constantly over the T1 time interval as explained hereinbefore relating to flowchart blocks 205-209. As explained hereinbefore if regulator 25 determines the presence of the a.c. signals substantially continuously for time interval T1, regulator 25 begins operating in the open loop operating mode at block 211, as illustrated around a time $T_{O1}$+T1 in FIG. 3, and then delays for the settling time illustrated in flowchart blocks 213-215. After the settling delay, the operational sequence of flowchart blocks 218-225 is performed as explained hereinbefore. However, since one of the component failures occurred, the a.c. signals would be absent at some time after asserting the OL signal. Circuit 60 detects the absence of the a.c. signals and negates the DT signal as illustrated by plot 108 at a time after time $T_{O1}$+T1. In the operation sequence of flowchart blocks 218-225, circuit 90 ensures that TBT is reset and begins the Tc time interval as described hereinbefore. Since the DT signal is negated, circuit 90 sets the TBT bit as illustrated in flowchart block 224 and in plot 117 of FIG. 3. When the Tc time interval expires in flowchart block 225, circuit 90 negates the OL signal and sets regulator 25 to again operate in the normal mode (flowchart block 227 and plot 111 around time $T_{O1}$+T1+Ts+Tc) in order to prevent the output voltage from changing an excessive amount. Circuit 90 also determines that the TBT bit is set and asserts the FL control signal indicating the presence of one of the component failures as illustrated by flowchart blocks 228 and 233 and plots 117 and 119 in FIG. 3.

In addition to detecting the a.c. signals to determine a component failure, regulator 25 may also use the OV and OV signals to determine if capacitor 16 is not connected to output 57 or if capacitor 16 is missing. When regulator 25 is operating in the open loop operating mode, the fixed value of current 56 could change the value of the output voltage. If capacitor 16 is not connected to output 57, the output voltage may increase or decrease rapidly. As a result, the output voltage may quickly increase or decrease to a value that asserts either the OV or UV signal as illustrated by dashed lines 126 or 129 in FIG. 3. If either of the OV or UV signals is asserted during the settling delay illustrated in flowchart block 214, circuit 90 determines this to result from capacitor 16 being missing or not connected and immediately negates the OL signal and asserts the FL signal as illustrated by flowchart blocks 214, 231, and 233 and also illustrated in FIG. 3 by dashed lines 126 and 129, and 120 of respective plots 124, 127, and 119. It is also possible that capacitor 16 may be connected in blocks 213-215, but becomes missing thereafter or that even if capacitor 16 were missing or not connected during the settling delay of block 213-215, the OV or UV signal may not become asserted until circuit 90 is operating in the Tc time interval of blocks 221-225. Therefore, block 221 also checks for the asserted OV or UV signal. If OV or UV become asserted during the Tc time interval, circuit 90 determines this to result from capacitor 16 being missing or not connected to output 57 and immediately negates the OL signal and asserts the FL signal as illustrated by flowchart blocks 221, 231, and 233.

Those skilled in the art can see that circuit 90 may also use the assertion of the OV or UV signals while operating in the open loop operating mode to assert a separate control signal (not shown) that is representative only of the component failure of capacitor 16 missing or not connected to output 57, where the FL signal can be representative of various component failures including capacitor 16 missing or not connected as determined from detecting the absence of the a.c. signals in the open loop operating mode.

It will be apparent to those skilled in the art, that regulator 25 continually loops through the sequence of flowchart blocks 200-233 so that a component failure may not be detected on one pass through the sequence but will be detected on the next pass through the sequence. In the preferred embodiment, the time required to complete one pass through the sequence is typically less than about one half of a milli-second (0.5 msec.). In this preferred embodiment, the T1 time interval is about five hundred (500) micro-second and the Tc time interval is about two (2) micro-second. Those skilled in the art will appreciate that the Ts Time interval is dependent on the circuitry that is used, and in some embodiments may be omitted.

Those skilled in the art will appreciate that the waveforms of FIG. 3 and the flowchart of FIG. 4 can be used as an input into a computer aided design (CAD) system so that the CAD system may generate a logic circuit that implements the logic and states and waveforms that are illustrated in FIGS. 3 and 4. Such CAD systems generally use a High level Descriptor Language (HDL) as an input. Such CAD and HDL systems are well known to those skilled in the art.

In order to facilitate the hereinbefore described functionality for regulator 25, input 26 is connected to a source of transistor 53 and a source of transistor 54. A drain of transistor 53 is commonly connected to a gate of transistor 53, to a gate of transistor 54, and to a drain of transistor 51. A drain of transistor 54 is commonly connected to output 57, a first terminal of resistor 13, an input of circuit 33, input 61 of circuit 60, and to a first terminal of resistor 97. A second terminal of resistor 97 is commonly connected to an inverting input of comparator 95 and to a first terminal of resistor 98. A second terminal of resistor 98 is commonly connected to a non-inverting input of comparator 96 and to a first terminal of resistor 99 which has a second terminal connected to return 27. Ref. 3 has an output commonly connected to a non-inverting input of comparator 95 and an inverting input of comparator 96. The output of comparator 96 is connected to a first input of circuit 90 and an output of comparator 95 is connected to a second input of circuit 90. The FL output of circuit 90 is connected to output 91 of regulator 25. The OL output of circuit 90 is commonly connected to a control input of circuit 33 and a control input of multiplexer 85. The control input of multiplexer 85 is commonly connected to a gate of transistor 87 and an input of inverter 88. An output of inverter 88 is connected to a gate of transistor 86. A drain of transistor 86 is connected to the output of amplifier 82. A source of transistor 86 is commonly connected to a source of transistor 87 and to node 49. A drain of transistor 87 is connected to output 45 of circuit 33. The control input of circuit 33 is connected to a gate of transistor 44. A drain of transistor 44 is commonly connected to a first terminal of capacitor 36 and to a non-inverting input of amplifier 40. An output of amplifier 40 is connected to a gate of transistor 42 which has a drain connected to output 45. A source of transistor 42 is connected to an inverting input of amplifier 40 and a first terminal of resistor 38. A second terminal of resistor 38 is commonly connected to output 57, a second terminal of capacitor 36, and a first terminal of resistor 35. A second terminal of resistor 35 is commonly connected to a source of transistor 44 and to a drain transistor 47 which has a source connected to return 27. A gate of transistor 47 is commonly connected to a gate of transistor 48, node 49, a drain of transistor 48, and a gate of transistor 51. A source of transistor 48 is commonly connected to a source of transistor 51, return 27, and a first terminal of resistor 14. A second terminal of resistor 14 is connected to node 15, a second terminal of resistor 13, and an inverting input of amplifier 82. A non-inverting input of amplifier 82 is connected to an output of Ref. 1. Input 61 of circuit 60 is commonly connected to a first terminal of resistor 75 and a first terminal of capacitor 62. A second terminal of resistor 75 is commonly connected to the first terminal of capacitor 74, a first terminal of resistor 63, a supply input of amplifier 68, a drain of transistor 69, and a supply input of comparator 78. A second terminal of capacitor 74 is commonly connected to return 27, a first terminal of resistor 64, a common supply terminal of amplifier 68, a first terminal of resistor 72, a first terminal of capacitor 73, and a common supply terminal of comparator 78. A second terminal of resistor 63 is commonly connected to node 65, a second terminal of resistor 64, and a non-inverting input of amplifier 68. An inverting input of amplifier 68 is commonly connected to node 70, a second terminal of resistor 72, a source of transistor 69, a second terminal of capacitor 73, and a non-inverting input of comparator 78. A gate of transistor 69 is connected to an output of amplifier 68. An output of comparator 78 is connected to the DT output of circuit 60 and to the DT input of circuit 90. Regulator 30 is connected between input 26 and return 27. Output 31 of regulator 30 is connected to supply power to a power input of amplifier 82.

Figure 5:
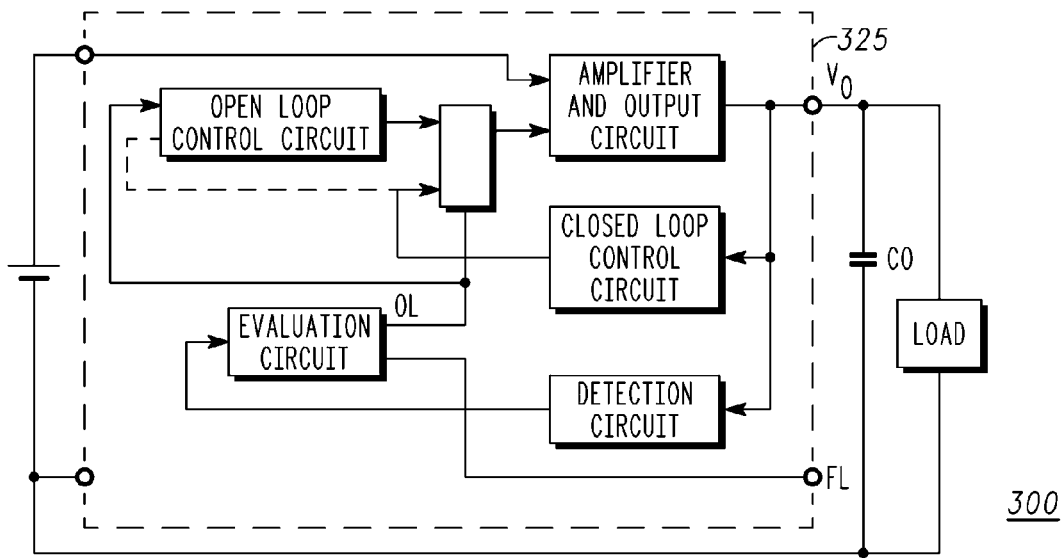
FIG. 5 schematically illustrates a block diagram of an example of a closed loop control circuit in accordance with the present invention.

FIG. 5 schematically illustrates an example of a closed loop control system 300 that includes a closed loop control circuit 325. Circuit 325 is a generalized block diagram of an analog control circuit that receives an input signal Vin and forms a control output signal Vo to operate a load during a normal operating mode. For example, circuit 325 may be controlling the speed of a motor or other type of load. Circuit 325 is configured to open the control loop and operate in an open loop mode and to detect the presence or absence of a.c. signals during the open loop operation in order to determine the presence or absence of a stabilization element of the control loop, such as an output capacitor $C_o$. Circuit 325 is a generalized block diagram that illustrates that the circuit elements of FIG. 2 may have various other implementations. Circuit 325 includes an output circuit that forms the output signal. In the normal operating mode, the output circuit forms the output signal from the output of an amplifier of the control loop, and in the open loop operating mode the output circuit forms the output signal from a fixed value. A detection circuit detects a.c. signals on the output signal. An evaluation circuit evaluates if the a.c signals continue in the open loop operating mode.

Figure 6:
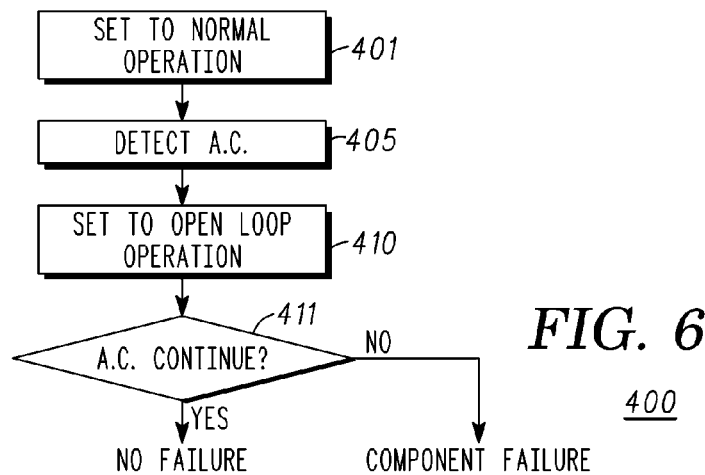
FIG. 6 is an example of a simplified flowchart that illustrates some of the operations that are performed by the circuit of FIG. 2 and FIG. 5 in accordance with the present invention.

FIG. 6 is a simplified flowchart 400 that illustrates some of the operations that are performed by circuit 325 and that may be performed by regulator 25. As can be seen from FIGS. 2-6, that in one embodiment circuit 325 and regulator 25 include a method of forming a test circuit comprising: configuring a control circuit, such as circuit 325 or regulator 25, to operate in an analog mode to receive an input voltage and form an output current, such as current 56, to charge an output capacitor, such as capacitor 16, in order to form an output signal, such as the output voltage, on an output, such as output 57, of the control circuit, the control circuit having a normal operating mode and a open loop operating mode; configuring the control circuit to receive a feedback signal that is representative of the output signal, such as the FB signal, and regulate the output signal responsively to the feedback signal during the normal operating mode; configuring the control circuit to detect a.c. signals on the output signal and responsively set the control circuit to operate in an open loop operating mode; and configuring the control circuit to determine if the component failure is absent by determining if the a.c. signal discontinues while operating in the open loop operating mode.

Another embodiment of circuit 325 or regulator 25 includes configuring the control circuit to form an output current in the open loop operating mode responsively to a signal having a substantially fixed value and not to the feedback signal.

Figure 7:
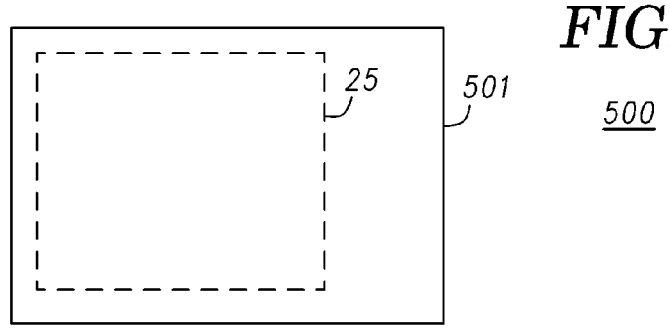
FIG. 7 illustrates an enlarged plan view of a semiconductor device that includes the voltage regulator of FIG. 2 in accordance with the present invention.

FIG. 7 illustrates an enlarged plan view of a portion of an embodiment of a semiconductor device or integrated circuit 500 that is formed on a semiconductor die 501. Regulator 25 or circuit 325 may be formed on die 501. In one embodiment, regulator 25 or circuit 325 is a portion of an ASIC circuit that is formed on die 501. Thus, die 501 may also include other circuits that are not shown in FIGS. 6/7 for simplicity of the drawing. In another embodiment, regulator 25 may be formed on die 501 and packaged in a four terminal semiconductor package. Regulator 25 or circuit 325 and device or integrated circuit 500 are formed on die 501 by semiconductor manufacturing techniques that are well known to those skilled in the art.

Thus, one skilled in the art will appreciate from FIG. 5 and the explanations of FIGS. 2-4 and 5-7, that according to another embodiment a voltage regulator having a component test circuit may comprise that the voltage regulator is configured to receive an input voltage and form an output current to charge an output capacitor in order to form an output voltage on an output of the voltage regulator, the voltage regulator having a normal operating mode and a open loop operating mode; an error amplifier, such as amplifier 82, coupled to receive a feedback voltage that is representative of the output voltage and form an error signal on an output of the error amplifier, the voltage regulator configured to regulate the output voltage responsively to the feedback voltage during the normal operating mode; a current control circuit, such as a circuit 33, configured to receive the error signal from the error amplifier and store a value of the error signal during the normal operating mode, the current control circuit configured to form an output signal that is representative of the stored value of the error signal during the open loop operating mode; an output circuit configured to receive the output signal from the current control circuit during the open loop operating mode and form the output current to be representative of the output signal; a first circuit, such as a circuit 60, configured to receive the output voltage and detect a.c. signals on a d.c. value of the output voltage, wherein the first circuit is configured to form a first control signal, such as a DT control signal, indicating detection of the a.c. signals; and a logic circuit, such as circuit 90, coupled to receive the first control signal and to use the first control signal to assert a second control signal, such as the OL control signal, and set the operating mode of the voltage regulator to the open loop operating mode, the logic circuit configured to use the first control signal to detect a component failure and responsively assert a third control signal, such as the FL control signal, after detecting the component failure.

According to another embodiment, the logic circuit sets the operating mode to the open loop operating mode and asserts the second control signal if the a.c. signals continue for at least a time interval, such as the T1 time interval, during the normal operating mode. According to yet another embodiment, the logic circuit is configured to receive the first control signal and if the first control signal remains asserted for the time interval then responsively assert the second control signal and set the voltage regulator to operate in the open loop operating mode.

The skilled artisan will also appreciate that according to another embodiment a method of forming a voltage regulator having a component test circuit may comprise configuring the voltage regulator to receive an input voltage and form an output current to charge a capacitor in order to regulate an output voltage on an output of the voltage regulator, the voltage regulator having a normal operating mode and a open loop operating mode; configuring the voltage regulator to receive a feedback signal that is representative of the output voltage and regulate the output voltage responsively to the feedback signal during the normal operating mode; configuring a first circuit, such as circuit 60, to detect a.c. signals of the output voltage; configuring a second circuit, such as circuit 90, to set the voltage regulator to operate in the open loop operating mode responsively to the first circuit detecting the a.c. signals on the output voltage for a first time interval; and configuring the second circuit to detect a component failure responsively to the first circuit not detecting a.c. signals on the output voltage responsively to the voltage regulator operating in the open loop operating mode and to detect an absence of the component failure responsively to the first circuit detecting a presence of a.c. signals on the output voltage while operating in the open loop operating mode.

In view of all of the above, it is evident that a novel device and method is disclosed. Included, among other features, causing a closed loop control system to operate in an open loop configuration, then at some time during the open loop operation detecting the presence or absence of a.c. signals in the output signal of the control loop to detect the presence or absence of a component failure. The advantage of this method is that the a.c. signals can be correctly detected also in harsh environment with a lot of EMI disturbances, such as in the environment of controlling an internal combustion engine. Additionally, the presence of EMI induced noise may also be detected and differentiated from a component failure. Thus, the system may continue to operate in the case that the a.c. signals result from EMI disturbances and not from a component failure.

While the subject matter of the invention is described with specific preferred embodiments, the foregoing drawings and descriptions thereof depict only typical and exemplary embodiments of the invention subject matter and are not therefore to be considered to be limiting of its scope. It is evident that many alternatives and variations will be apparent to those skilled in the art. As will be appreciated by those skilled in the art, the exemplary form of regulator 25 is used as a vehicle to explain a method of detecting the absence of an element in a closed loop control system. Many of the circuit elements of regulator 25 that was explained in the description of FIGS. 2-4 are example implementations and the circuit elements may be implemented by various alternative circuits. For example, circuit 60 is illustrated to have a certain circuit implementation; however, other circuit elements may be used as long as the circuit detects the presence or absence of the a.c. signals of the output voltage. Circuit 33 is also illustrated to have a specific circuit implementation, however, other circuit implementations may also be used as long as the circuit forms a fixed signal that can be used while operating in the open loop operating mode. The storage element of circuit 33 is illustrated as capacitor 36, however, it may also be any other type of well known storage element. Circuit 33 may even simply be a fixed reference signal from a reference generator such as the type illustrated by Ref. 1 in FIG. 2. Also, circuit 33 may be omitted and regulator 25 may be configured to not provide an output current during the open loop operating mode, but to still use the presence or absence of a.c. signals to determine the presence or absence of the capacitor. Although load 17 is illustrated as external to the circuit of regulator 25 or circuit 325, the load may be formed on a semiconductor die along with regulator 25 or circuit 325.

The output circuit of FIG. 2 may also have other implementations as long as the output circuit uses a closed loop regulator to form current 56 in the normal operating mode and uses the fixed signal in the open loop operating mode. Also, capacitors 73 and 36 may be controlled to charge to a value that is different from the average value of the received signal.

Evaluation circuit 90 may also have various circuit embodiments. Circuit 90 may be a combinational digital logic, or a state machine, or a high speed micro-processor, or may even be an analog control circuit, as long the circuit receives signals similar to the OD, OV, and UV signals, forms the time intervals described in the flowchart of FIG. 4, evaluates the presence or absence of a.c. signals for the time intervals as explained, and causes the regulator to operate in the normal or open loop operating modes as explained hereinbefore.

Also, the settling delays illustrated in the flowchart of FIG. 4 may be omitted in some systems.

Additionally, the feedback signal is illustrated in the example embodiment as a voltage, but a current or other type of signal may also be used.

Additionally, those skilled in the art will appreciate that the principle of using a.c. signals in a signal that is formed by a closed loop control system to detect a failure of a system component can be extended to any closed loop system where any external component(s) can affect the stability of the system. In the example embodiments described in the description of FIGS. 2-4, the closed loop control system is an analog closed loop voltage regulator, however, the functionality provided by the system described in FIGS. 2-4 can be applied to any closed loop control system as illustrated by FIGS. 5 and 6.

The word "connected" is used throughout for clarity of the description, however, it is intended to have the same meaning as the word "coupled". Accordingly, "connected" should be interpreted as including either a direct connection or an indirect connection.

The invention claimed is:
1. A voltage regulator having a component test circuit comprsing:
   the voltage regulator configured to receive an input voltage and form an output current to charge an output capacitor in order to form an output voltage on an output of the voltage regulator, the voltage regulator having a normal operating mode and a open loop operating mode;

an error amplifier coupled to receive a feedback voltage that is representative of the output voltage and form an error signal on an output of the error amplifier, the voltage regulator configured to regulate the output voltage responsively to the feedback voltage during the normal operating mode;

a current control circuit configured to receive the error signal from the error amplifier and store a value of the error signal during the normal operating mode, the current control circuit configured to form an output signal that is representative of the stored value of the error signal during the open loop operating mode;

an output circuit configured to receive the output signal from the current control circuit during the open loop operating mode and form the output current to be representative of the output signal;

a first circuit configured to receive the output voltage and detect a.c. signals on d.c. value of the output voltage, the first circuit configured to form a first control signal indicating detection of the a.c. signals; and a logic circuit coupled to receive the first control signal and to use the first control signal to assert a second control signal and set the operating mode of the voltage regulator to the open loop operating mode, the logic circuit configured to use the first control signal to detect a component failure and responsively assert a third control signal after detecting the component failure.

2. The voltage regulator of claim 1 wherein the voltage regulator regulates the output voltage as a linear voltage regulator that regulates the output voltage in a linear manner and wherein the voltage regulator is not a switching regulator that switches the output current between an on state and an off state in order to regulate the value of the output voltage during the normal operating mode.

3. The voltage regulator of claim 1 wherein the current control circuit includes a storage capacitor coupled to store a voltage that is representative of the error signal of the error amplifier, a switch to decouple the storage capacitor from the output of the error amplifier responsively to operating in the open loop operating mode, and a voltage to current conversion circuit that forms the output signal of the current control circuit as a substantially constant current on the output of the current control circuit.

4. The voltage regulator of claim 1 wherein the logic circuit sets the operating mode to the open loop operating mode and asserts the second control signal if the a.c. signals continue for at least time interval during the normal operating mode.

5. The voltage regulator of claim 4 wherein the logic circuit is configured to receive the first control signal and if the first control signal remains asserted for the time interval then responsively assert the second control signal and set the voltage regulator to operate in the open loop operating mode.

6. The voltage regulator of claim 1 wherein the logic circuit is configured to detect the component failure and assert the third control signal responsively to an absence of a.c. signals for a time interval during the open loop operating mode.

7. The voltage regulator of claim 1 further including an under-voltage detector circuit and an over-voltage detector circuit wherein the logic circuit is configured to detect a missing connection between the output capacitor and the output of the voltage regulator responsively to receiving an over-voltage or an under-voltage detection while operating in the open loop operating mode.

8. A method of forming a voltage regulator having a component test circuit comprising:
configuring the voltage regulator to receive an input voltage and form an output current to charge a capacitor in order to regulate an output voltage on an output of the voltage regulator, the voltage regulator having a normal operating mode and a open loop operating mode;
configuring the voltage regulator to receive a feedback signal that is representative of the output voltage and regulate the output voltage responsively to the feedback signal during the normal operating mode;
configuring a first circuit to detect a.c. signals of the output voltage;
configuring a second circuit to set the voltage regulator to operate in the open loop operating mode responsively to the first circuit detecting the a.c. signals on the output voltage for a first time interval; and
configuring the second circuit to detect a component failure responsively to the first circuit not detecting a.c. signals on the output voltage responsively to the voltage regulator operating in the open loop operating mode and to detect an absence of the component failure responsively to the first circuit detecting a presence of a.c. signals on the output voltage while operating in the open loop operating mode.

9. The method of claim 8 further including configuring an output circuit to use a signal derived from the feedback signal to regulate the output voltage responsively to operating in the normal operating mode and to use a control signal having a substantially fixed value to form the output voltage responsively to operating in the open loop operating mode.

10. The method of claim 8 wherein configuring the second circuit to set the voltage regulator to operate in the open loop operating mode includes configuring the second circuit to set the voltage regulator to operate in the open loop operating mode responsively to the first circuit detecting the a.c. signals for a time interval while operating in the normal operating mode.

11. The method of claim 10 wherein configuring the second circuit to set the voltage regulator to operate in the open loop operating mode responsively to the first circuit detecting the a.c. signals for the time interval while operating in the normal operating mode includes configuring the second circuit to receive a detected signal from the first circuit representing presence of the a.c. signals and to determine if the detected signal represents the presence of the a.c. signals for the time interval.

12. The method of claim 8 wherein configuring the second circuit to detect the component failure includes configuring the second circuit to determine the component failure responsively to the first circuit not detecting the a.c. signals for a time interval after operating in the open loop operating mode.

13. The method of claim 12 further including configuring the second circuit to assert a failed control signal responsively to determining the component failure.

14. The method of claim 8 further including configuring the second circuit to determine an absence of a connection between the capacitor and the output of the voltage regulator responsively to receiving an over-voltage or under-voltage condition while operating in the open loop operating mode.

15. A method of forming a test circuit comprising:
configuring an control circuit to operate in an analog mode to receive an input voltage and form an output current to charge an output capacitor in order to form an output signal on an output of the control circuit, the control circuit having a normal operating mode and a open loop operating mode;

configuring the control circuit to receive a feedback signal that is representative of the output signal and regulate the output signal responsively to the feedback signal during the normal operating mode;

configuring the control circuit to detect. a.c. signals on the output signal and responsively set the control circuit to operate in an open loop operating mode; and configuring the control circuit to determine a component failure by determining if the a.c. signal discontinues while operating in the open loop operating mode.

16. The method of claim 15 wherein configuring the control circuit to detect a.c. signals in the output signal includes configuring the control circuit to set the control circuit to operate in the open loop operating mode responsively to detecting the a.c. signals for a first time interval while operating in the normal operating mode.

17. The method of claim 15 further including configuring the control circuit to determine an absence of the component failure by determining if the a.c. signals continue to be detected while operating in the open loop operating mode.

18. The method of claim 17 wherein configuring the control circuit to determine if the output capacitor is present includes configuring the control circuit to determine if the a.c. signals continue to be detected for a second time interval while operating in the open loop operating mode.

19. The method of claim 18 wherein configuring the control circuit to determine if the output capacitor is absence includes configuring the control circuit to determine if the a.c. signals are absent for the second time interval while operating in the open loop operating mode.

20. The method of claim 15 wherein configuring the control circuit to detect a.c. signals on the output signal and responsively set the control circuit to operate in the open loop operating mode includes configuring the control circuit to form an output current in the open loop operating mode responsively to a signal having a substantially fixed value and not to the feedback signal.

* * * * *